(12) United States Patent
Schrödinger

(10) Patent No.: US 6,885,443 B2
(45) Date of Patent: Apr. 26, 2005

(54) DRIVE DEVICE FOR A LIGHT-EMITTING COMPONENT

(75) Inventor: Karl Schrödinger, Berlin (DE)

(73) Assignee: Infineon Technologies AG, Munich (DE)

(*) Notice: Subject to any disclaimer, the term of this patent is extended or adjusted under 35 U.S.C. 154(b) by 99 days.

(21) Appl. No.: 10/613,368

(22) Filed: Jul. 3, 2003

(65) Prior Publication Data
US 2005/0002019 A1 Jan. 6, 2005

(51) Int. Cl.[7] .................................................. G01J 1/42
(52) U.S. Cl. .................. 356/218; 327/29.011; 250/221; 250/205; 330/253
(58) Field of Search ................................ 356/213–219, 356/225–226, 72–73; 250/221, 205; 327/165, 29.011, 38.02, 38.1; 330/253; 315/169.3; 345/204

(56) References Cited

U.S. PATENT DOCUMENTS

| 4,071,886 A | * | 1/1978 | Eicher | 700/28 |
| 4,812,642 A | * | 3/1989 | Hasegawa et al. | 250/221 |
| 6,044,095 A | * | 3/2000 | Asano et al. | 372/31 |
| 6,456,141 B1 | * | 9/2002 | Nishizono et al. | 327/345 |
| 6,670,773 B1 | * | 12/2003 | Nakamura et al. | 315/169.3 |

* cited by examiner

Primary Examiner—Gregory J. Toatley, Jr.
Assistant Examiner—Sang H. Nguyen
(74) Attorney, Agent, or Firm—Laurence A. Greenberg; Werner H. Stemer; Ralph E. Locher

(57) ABSTRACT

A drive device for a light emitting component includes a reference source for generating a power stipulation signal that stipulates a desired power. A correction device compensates for a temperature-dictated measurement error of the photodetector by modifying, in a temperature-dependent manner, the power stipulation signal generated by the reference source. A regulating device is connected to the reference source and generates a regulating signal that regulates the light power of the light emitting component to minimize the deviation between the actual light power and the desired light power. This configuration avoids monitor tracking errors of a monitor diode used to measure the actual light power.

18 Claims, 2 Drawing Sheets

DRIVE DEVICE FOR A LIGHT-EMITTING COMPONENT

BACKGROUND OF THE INVENTION

Field of the Invention

In drive devices for light-emitting components, for example lasers, as is known, detectors (e.g. monitor photodiodes) are present which measure the light power of the light-emitting component and enable the light power to be regulated.

In monitor photodiodes integrated in laser diodes, various causes give rise to so-called "monitor tracking errors". These "monitor tracking errors" are based on temperature-dependent inaccuracies or measurement errors of the monitor diode, which should actually measure the coupled-in optical power of the laser diode correctly. In the case of an edge-emitting laser, for example, a "monitor tracking error" may be based on the fact that the optical power at the front mirror of the laser and the optical power at the rear mirror of the laser are not proportional—in a temperature-dependent manner. In the case of a surface-emitting laser (VCSEL laser), a "monitor tracking error" may also be caused by a mode-selective and thus temperature-dependent coupling between the laser and its monitor photodiode.

SUMMARY OF THE INVENTION

The invention is based on the object of specifying a drive device for a light-emitting component in which fluctuations in the output power of the light-emitting component on account of measurement errors of the assigned photodetector, in particular on account of "monitor tracking errors", are avoided.

Accordingly, the invention provides a drive device having a reference source, which generates a power stipulation signal stipulating a desired light power. Moreover, the drive device has a photodetector for measuring the respective actual light power. A regulating device is connected to the photodetector and to the reference source. The regulating device generates a regulating signal, which regulates the light power, for the light-emitting component. In addition, the drive device according to the invention has a correction device, which compensates for temperature-dictated measurement errors of the photodetector by modifying, in a temperature-dependent manner, the power stipulation signal generated by the reference source.

An essential advantage of the drive device according to the invention is to be seen in the fact that this drive device can be realized with relatively simple and cost-effective components, since only the power stipulation signal generated by the reference source has to be modified in a temperature-dependent manner in order to compensate for the temperature-dictated measurement errors.

A further essential advantage of the drive device according to the invention is that the hitherto customary components for light regulation, that is to say the regulating device and the photodetector, can continue to be used unchanged; these components do not have to be modified since, according to the invention, only the desired light power or the power stipulation signal is changed in a temperature-dependent manner.

Digital components are particularly cost-effective, so that it is regarded as advantageous if the correction device is formed at least partly by digital components.

In accordance with one advantageous refinement of the drive device, the correction device has a memory. Correction values for the temperature-dependent modification of the power stipulation signal are stored in the memory.

Preferably, the correction device has a control device, which, with a temperature sensor, measures the temperature of the monitor diode or a temperature proportional thereto and then reads from the memory that correction value which is respectively assigned to the measured temperature value.

The correction values and the assigned temperature levels or temperature ranges may be stored preferably in table form in the memory. The table may preferably be configured as a "look-up table".

The control device of the correction device is preferably formed by a controller module, in particular by a microprocessor.

In order to ensure that the temperature response or the compensation regulation can be changed arbitrarily by the user or can be set externally, it is regarded as advantageous if the memory and thus the memory values contained therein are arbitrarily programmable. In such a case, it is possible to compensate for tracking errors with arbitrary temperature characteristic curves; the compensation can thus be adapted to the optical components respectively used—thus e.g. to the respective laser and the respectively assigned monitor diode.

Furthermore, the correction device preferably has a digital-to-analog converter connected downstream of the control device. This digital-to-analog converter (D/A converter) forms an analog modification signal from the correction value read from the memory by the control device or an auxiliary correction value derived therefrom by the control device. The power stipulation signal of the reference source is modified using the modification signal.

In the context of a further advantageous refinement, the control device has an analog adder, which adds the power stipulation signal of the reference source and the modification signal of the D/A converter. The adder may be formed by an operational amplifier circuit, for example.

As has already been explained in the introduction, "monitor tracking" errors occur particularly in the case of laser diodes, so that it is regarded as advantageous if the drive device is used for driving a laser as the light-emitting component. The photodetector for detecting the light power of the laser is then preferably a monitor diode of the laser.

The invention furthermore relates to a method for driving a light-emitting component.

In order to be able to carry out such a method without a high outlay and using simple components, the invention provides for a desired light power to be stipulated and for the actual light power to be measured by means of a photodetector. The light power of the light-emitting component is regulated in such a way that the deviation between desired light power and the measured actual light power becomes minimal. A temperature-dictated measurement error of the photodetector is compensated for by virtue of the desired light power being modified in a temperature-dependent manner.

DESCRIPTION OF THE PREFERRED EMBODIMENTS

Figure 1:
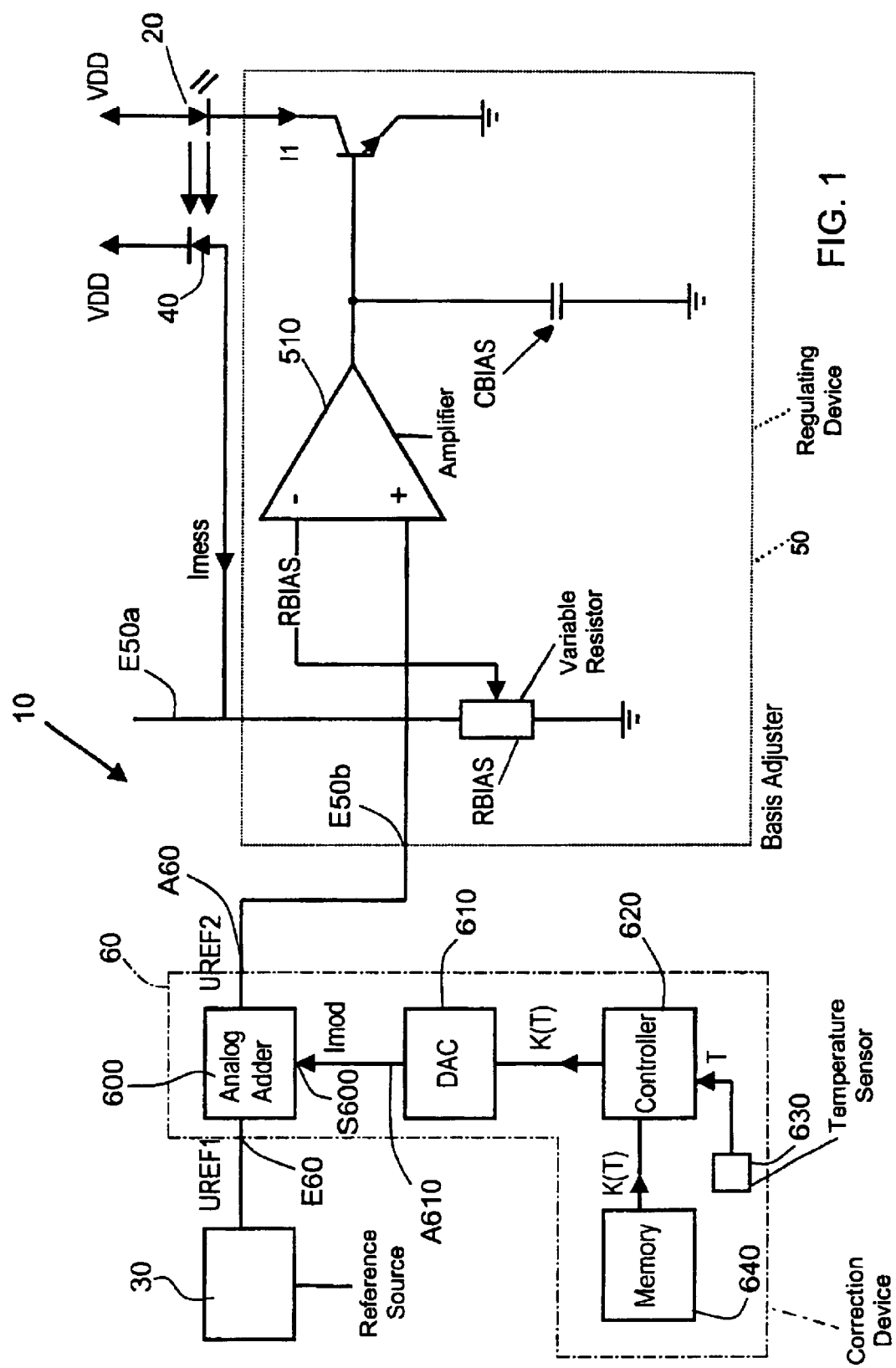
FIG. 1 shows an exemplary embodiment of a drive device according to the invention.

FIG. 1 reveals a drive device 10 for a laser diode 20. The drive device 10 has a reference source 30, which generates a power stipulation signal UREF1 stipulating a desired light power.

The drive device 10 furthermore has a monitor diode 40, which is suitable as photodetector for measuring the actual light power of the laser diode 20.

The monitor diode 40 is connected to an input E50a of a regulating device 50 embodied as a BIAS regulator. The regulating device 50 generates a regulating signal that controls the light power of the laser diode 20—for example a laser current Il—for the laser 20. Furthermore, the regulating device 50 is connected by its further input E50b to the reference source 30 via a correction device 60.

The task of the correction device 60 is to modify the power stipulation signal UREF1 of the reference source 30, to be precise in such a way that a temperature-dictated measurement error of the monitor diode 40 is compensated for. For this purpose, the correction device 60 generates a modified power stipulation signal UREF2 from the power stipulation signal UREF1 stipulated by the reference source 30.

The modified power stipulation signal UREF2 passes to the further input E50b of the regulating device 50 and is processed by the regulating device 50. The task of the regulating device 50 is to set the laser current Il for the laser diode 20, taking account of the modified power stipulation signal UREF2 present on the input side and the actual light power measurement signal Imeas supplied by the monitor diode 40, in such a way that the deviation between the actual light power and the desired light power stipulated by the modified power stipulation signal UREF2 becomes minimal.

In order to generate the laser current Il, the regulating device 50 has an operational amplifier 510, whose "inverting" input is connected to a variable resistor RBIAS. A voltage which is proportional to the current Imeas flowing through the monitor diode 40 is thus present at the "inverting" input of the operational amplifier 510.

By means of the variable resistor RBIAS, the laser current Il can be preset "by hand" or in user-specific fashion.

The "noninverting" input of the operational amplifier 510 is connected to the further input E50b of the regulating device 50 and thus has the modified power stipulation signal UREF2 of the correction device 60 applied to it.

On the output side, the operational amplifier 510 is connected to a base terminal of a transistor whose emitter terminal is grounded and whose collector terminal forms the terminal for the laser diode 20. The output voltage of the operational amplifier 510 is "buffered" by a capacitance CBIAS.

At its input E60, the correction device 60 has an analog adder 600, whose output forms the output A60 of the correction device 60. The analog adder 600 is additionally equipped with a control input S600 connected to an output A610 of a digital/analog converter (D/A converter) 610. On the input side, the D/A converter 610 is connected to a control device 620 connected to a temperature sensor 630 and a freely programmable memory (RAM module) 640.

The drive device in accordance with FIG. 1 is operated as follows:

The reference source 30 generates the power stipulation signal UREF1 stipulating the desired light power of the laser diode 20. This power stipulation signal UREF1 is modified by the correction device 60, the modified power stipulation signal UREF2 being generated. The modified power stipulation signal UREF2 passes to the regulating device 50, which drives the laser diode 20 by means of the laser current Il in such a way that the laser diode 20 emits a light power corresponding to the modified power stipulation signal UREF2.

The light power of the laser diode 20 is measured by means of the monitor diode 40, which forwards a measurement signal Imeas corresponding to the measured actual light power to the regulating device 50. The operational amplifier 510 within the regulating device 50 then readjusts the laser current Il in such a way that the actual light power measured by the monitor diode 40 corresponds to the desired light power stipulated by the modified power stipulation signal UREF2.

If the monitor diode 40 were an "ideal" monitor diode having no temperature-dictated measurement error whatsoever, then a modification of the power stipulation signal UREF1 would be unnecessary. In reality, however, monitor diodes such as the monitor diode 40 have so-called "monitor tracking errors"; these are temperature-dependent measurement errors. On account of these measurement errors, the actual light power measured by the monitor diode 40 does not correspond to the real actual light power of the laser diode 20. A regulating error of the regulating device 50 thus occurs, so that the laser current Il is no longer set correctly by the regulating device 50.

In order to avoid this temperature-dictated measurement error of the monitor diode 40, the correction device 60 modifies the power stipulation signal UREF1 generated by the reference source 30 to form the modified power stipulation signal UREF2. This is done as follows:

By means of the temperature sensor 630, the control device 620 measures the temperature respectively prevailing at the monitor diode 40, or a temperature proportional thereto. Depending on the temperature measurement value T measured by means of the temperature sensor 630, the control device 620 reads from the memory 640 a correction value (K(T)) appropriate for the respective temperature measurement value T. For this purpose, correction values together with the assigned temperature levels or temperature ranges are stored in table form in the memory 640. This table forms a so-called "look-up table". The look-up table may contain "delta values" for n different temperature levels, for example, which values modify the original power stipulation signal UREF1 of the reference source 30 "additively" or "subtractively". The "look-up table" may be constructed for example in such a way that the memory addresses of the memory cells of the memory 640 in each case correspond to a temperature or a temperature measurement value T; the content of the memory cells then specifies the assigned correction value K(T). The number of temperature levels results from the number of memory cells implemented and thus from the number of available address bits (e.g. 128 memory cells given 7 bits).

Once the control device 620 has read the correction value K(T) associated with the respective temperature measurement value T from the memory 640, it transfers said correction value to the D/A converter 610. The D/A converter 610 generates from this an analog modification signal Imod and transfers the latter to the analog adder 600. The analog adder 600 uses the analog modification signal Imod to generate the modified power stipulation signal UREF2 from the power stipulation signal UREF1 present on the input side by means of addition.

Figure 2:
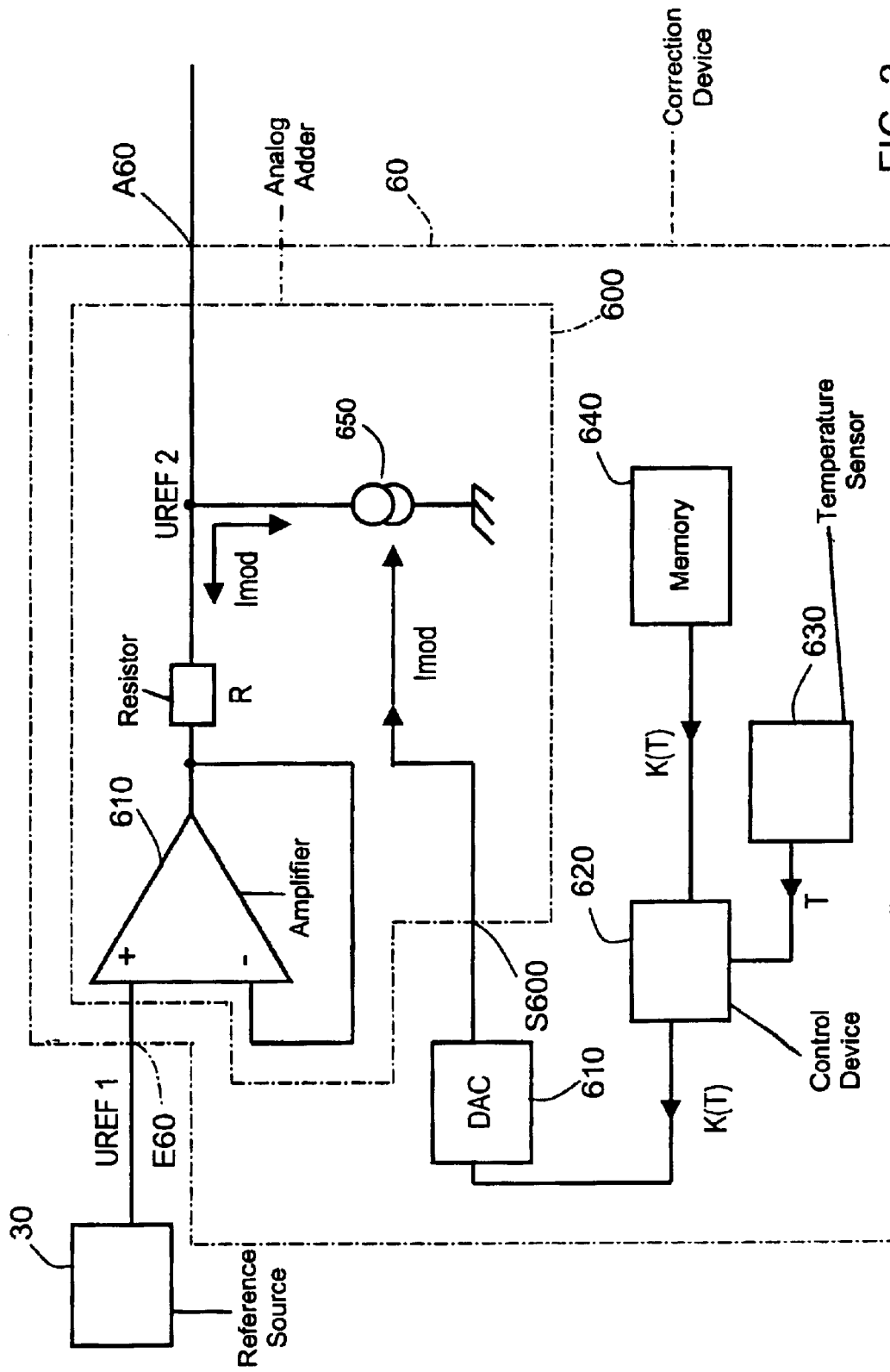
FIG. 2 shows an exemplary embodiment of a correction device of the kind that can be used in the drive device according to the invention as shown in FIG. 1.

The functioning of the analog adder 600 is illustrated in detail in FIG. 2. FIG. 2 reveals the reference source 30 connected to an input E600 of the analog adder 600. Also shown is the D/A converter 610, which is connected to the control input S600 of the analog adder 600 and feeds in the modification signal Imod.

The analog adder 600 has an operational amplifer 610, whose "noninverting" input is connected to the reference source 30. The output of the operational amplifier 610 is connected to the "inverting" input of the operational amplifier and, in addition, to one terminal of a resistor R. The other terminal of the resistor R forms the output of the adder and thus the output A60 of the correction device 60. A current source 650 is additionally connected to the other terminal of the resistor R. The current source 650 generates a current Imod' corresponding to the analog modification signal Imod of the D/A converter 610.

A positive or negative analog modification signal Imod generates a positive or negative current flow Imod' through the current source 650 and thus a voltage drop UREF2-UREF1 across the resistor R. This "positive" or "negative" voltage drop—depending on the direction of the current Imod'—is added to the reference voltage UREF1. In other words, the modified power stipulation signal UREF2 results in accordance with:

$$UREF2 = UREF1 + Imod'*R$$

where the current direction of the current Imod' depends on the respective sign of the analog modification signal Imod of the digital-to-analog converter 610.

What is claimed is:

1. A drive device for a light-emitting component, comprising:
   a reference source for generating a power stipulation signal stipulating a desired light power;
   a photodetector for measuring an actual light power of the light-emitting component;
   a regulating device connected to said photodetector and said reference source, said regulating device generating a regulating signal for regulating the actual light power of the light-emitting component such that a deviation between the desired light power and the actual light power becomes minimal; and
   a correction device for compensating for a temperature-dictated measurement error of the photodetector by modifying, in a temperature-dependent manner, the power stipulation signal generated by said reference source.

2. The drive device according to claim 1, wherein said correction device includes a memory storing a plurality of correction values for modifying the power stipulation signal in the temperature-dependent manner.

3. The drive device according to claim 2, wherein:
   said correction device includes a control device and a temperature sensor;
   said control device and said temperature sensor are configured for obtaining a measured temperature value by measuring a temperature of the monitor diode or a temperature proportional to the temperature of the monitor diode; and
   said control device is configured for reading a correction value associated with the measured temperature value from said memory.

4. The drive device according to claim 3, wherein said control device is formed by a controller module.

5. The drive device according to claim 3, wherein said control device is formed by a microprocessor.

6. The drive device according to claim 2, wherein said memory stores the plurality of correction values and a plurality of temperature levels or temperature ranges associated with the plurality of correction values in table form.

7. The drive device according to claim 2, wherein said memory stores the plurality of correction values and a plurality temperature levels or temperature ranges associated with the plurality of correction values as look-up table.

8. The drive device according to claim 2, wherein said memory is freely programmable.

9. The drive device according to claim, 2, wherein:
   said correction device includes a control device and a temperature sensor;
   said control device and said temperature sensor are configured for obtaining a measured temperature value by measuring a temperature of the monitor diode or a temperature proportional to the temperature of the monitor diode;
   said control device is configured for reading a correction value associated with the measured temperature value from said memory; and
   said correction device includes a digital-to-analog converter connected downstream of said control device.

10. The drive device according to claim 9, wherein:
    said digital-to-analog converter forms an analog modification signal from the correction value read from said memory by said control device or an auxiliary correction value derived from the correction value;
    the power stipulation signal of said reference source (30) is modified using the modification signal.

11. The drive device according to claim 10, wherein:
    said correction device includes an analog adder configured for adding the modification signal of said digital-to-analog converter or an auxiliary modification signal formed from the modification signal to the power stipulation signal of said reference source.

12. The drive device according to claim 11, wherein said adder is formed by an operational amplifier circuit.

13. The drive device according to claim 1, in combination with the light-emitting component, wherein the light-emitting component is a laser.

14. The drive device according to claim 1, in combination with the light-emitting component, wherein the light-emitting component has a monitor diode forming said photodetector.

15. A method for driving a light-emitting component, which comprises:
    defining a stipulated desired light power by stipulating a desired light power;
    obtaining a measured actual light power by measuring an actual light power of the light-emitting component with a photodetector;
    regulating the light-emitting component such that a deviation between the desired light power and the measured actual light power becomes minimal;
    compensating for a temperature-dictated measurement error of the photodetector by modifying the stipulated desired light power in a temperature-dependent manner.

16. The method according to claim 15, which further comprises: reading a plurality of correction values from a memory for modifying the stipulated desired light power.

17. The method according to claim 16, which further comprises: storing the plurality of correction values in table form in the memory.

18. The method according to claim 16, which further comprises: storing the plurality of correction values as a look-up table in the memory.

* * * * *